(12) United States Patent
Lim

(10) Patent No.: US 8,193,026 B2
(45) Date of Patent: Jun. 5, 2012

(54) IMAGE SENSOR AND METHOD FOR MANUFACTURING THE SAME

(75) Inventor: Keun Hyuk Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 68 days.

(21) Appl. No.: 12/634,378

(22) Filed: Dec. 9, 2009

(65) Prior Publication Data

US 2010/0155873 A1    Jun. 24, 2010

(30) Foreign Application Priority Data

Dec. 18, 2008    (KR) .................. 10-2008-0129129

(51) Int. Cl.
*H01L 21/00*    (2006.01)

(52) U.S. Cl. ....................................... 438/69; 257/290

(58) Field of Classification Search .......... 257/290–292, 257/432, 460, E31.127, E31.032, E27.132; 438/48, 69, 98, 70
See application file for complete search history.

*Primary Examiner* — David Vu
(74) *Attorney, Agent, or Firm* — The Law Offices of Andrew D. Fortney; Andrew D. Fortney

(57) ABSTRACT

A backside illumination (BSI) image sensor having a light receiving part at the wafer or die backside, and a manufacturing method thereof, are disclosed. The method includes polishing the light receiving part so that a super via protrudes, forming a first insulating layer to cover the protruding super via and the light receiving part, forming a photoresist pattern on the first insulating layer to expose a pad region, etching the first insulating layer to form spacers at sides of the protruding super via, repeatedly forming a second insulating layer covering the spacers, the super via and the light receiving part and etching the second insulating layer so that the spacers increase in width and cover an upper surface of the light receiving part, and forming a metal pad in the pad region to contact the super via.

11 Claims, 4 Drawing Sheets

IMAGE SENSOR AND METHOD FOR MANUFACTURING THE SAME

This application claims the benefit of Korean Patent Application No. 10-2008-0129129, filed on 18 Dec. 2008, which is hereby incorporated by reference as if fully set forth herein.

BACKGROUND OF THE INVENTION

1. Field of the Invention

The present invention relates to a semiconductor device and a manufacturing method for the same, and more particularly, to an image sensor and a method for manufacturing the image sensor.

2. Discussion of the Related Art

An image sensor denotes a semiconductor device that converts an optical image into an electrical signal.

A charge coupled device (CCD), one type of image sensor, has metal oxide silicon (MOS) capacitors disposed very close to one another, wherein charge carriers are stored in and transferred from the capacitors.

A complementary MOS (CMOS) image sensor employs a switching method which uses a CMOS technology to form MOS transistors corresponding to the number of pixels, and successively detects outputs using the MOS transistors. The CMOS technology uses a control circuit and a signal processing circuit as peripheral circuits.

In the CMOS image sensor, for example, incident light reaches a photodiode (not shown) by passing through a micro lens (not shown) and a color filter (not shown), accordingly generating electrons and holes in a silicon substrate by conversion from optical energy. Thus-generated electrons are converted to and read out as voltage signals, which are processed and converted back to the form of images.

As the device size is reduced, the pixel size and a light receiving area are accordingly reduced. Consequently, the sensitivity may deteriorate. To this end, a 3D image sensor has recently been developed, wherein the light receiving area is formed in an upper part of a passivation region.

Hereinafter, the structure of a back-side illumination (BSI) image sensor of the 3D image sensors will be briefly described with reference to the accompanying drawings.

FIG. 1 is a cross-sectional view showing a 3D image sensor according to one related art.

The image sensor 10 includes a passivation layer 30, interlayer dielectrics 32, 34 and 36, a gate electrode 40, contacts 50, metal layers 52, a super via 60, color filters 80 and a metal pad 90.

Referring to FIG. 1, after an image sensor wafer 22 is completely constructed, the wafer 22 is turned upside down and bonded to another wafer 20.

In the bonded state, Chemical Mechanical Polishing (CMP) or backgrinding is performed with respect to a backside of the wafer 22, so that a silicon light receiving part 70 has a thickness of several micrometers (μm).

Through the light receiving part 70, data can be read out from the pixels to the super via 60.

However, according to the above-described image sensor, the metal pad 90 at the upper part of the super via 60 is formed directly on the silicon substrate 70. In this case, a short circuit may occur between the metal pad 90 formed of aluminum (Al) and the light receiving part 70 formed of Si.

FIG. 2 shows an example of the connection structure between a super via and a metal pad of a 3D image sensor according to another related art.

Referring to FIG. 2, plugs 62 protrude upward out of light receiving parts 72, to prevent the electric short circuit occurring in the BSI image sensor shown in FIG. 1.

Next, an insulating layer 100 is vapor-deposited on an upper part of the light receiving part 72 and the protruding plugs 62. Upper surfaces of the plugs 62 are exposed by performing CMP on an upper part of the insulating layer 100. Next, metal pads 92 are formed on the exposed upper surfaces of the plugs 62 and the upper part of the insulating layer 100. The light receiving part 72, the super via 62 and the metal pad 92 shown in FIG. 2 have the same functions as the light receiving part 70, the super via 60 and the metal pad 90 of FIG. 1, respectively.

However, the image sensor introduced in FIG. 2 has a risk in that the wafer 22 may be broken during the CMP process performed on the insulating layer 100.

SUMMARY OF THE INVENTION

Accordingly, the present invention is directed to an image sensor and a method for manufacturing the image sensor that substantially obviate one or more problems due to limitations and disadvantages of the related art.

An object of the present invention is to provide an image sensor capable of preventing a short circuit from occurring between a metal pad formed at an upper part of a super via and a silicon light receiving part in which the super via is embedded, while also preventing breakage of the wafer that includes the light receiving part, and a method for manufacturing the image sensor.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose(s) of the invention, as embodied and broadly described herein, a method of manufacturing a back-side illumination (BSI) image sensor that receives light through a light receiving part at the backside of a wafer, includes over-polishing the light receiving part so that an upper part of an embedded super via partially protrudes outward, forming a first insulating layer over the entire upper surface covering the protruding super via and the light receiving part, forming a photoresist pattern on an upper part of the first insulating layer to expose a pad region, etching the first insulating layer using the photoresist pattern as an etching mask to form spacers at lateral sides of the protruding super via, forming a second insulating layer on the entire surface covering the spacers, the super via and the light receiving part, etching the second insulating layer, and repeating the insulating layer forming and etching steps until widths of the spacers increase and an upper surface of the light receiving part is covered with adjoining spacers, and forming a metal pad in the pad region in contact with the super via.

In another aspect of the present invention, a BSI image sensor that receives light through a light receiving part at the backside of a wafer includes super vias formed in a pad region, protruding out of the light receiving part, spacers at lateral sides of each of the super vias covering the entire upper surface of the light receiving part, and a metal pad in the pad region in contact with a super via.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Reference will now be made in detail to various embodiments of the present invention, examples of which are illustrated in the accompanying drawings. Wherever possible, the same reference numbers will be used throughout the drawings to refer to the same or like parts.

Figure 3:
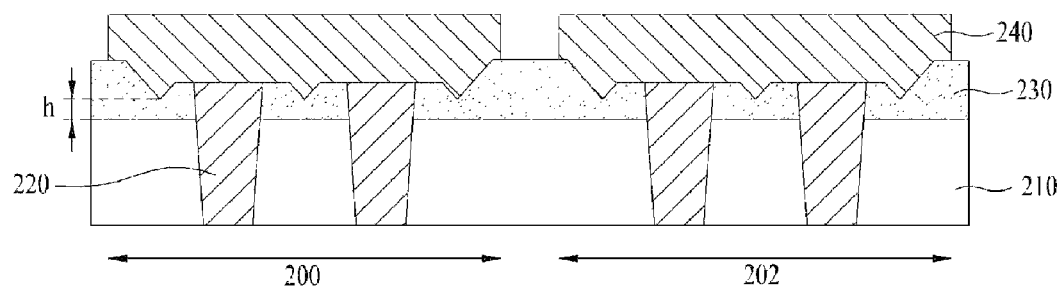
FIG. 3 is a cross-sectional view of an image sensor according to an embodiment of the present invention.

FIG. 3 is a cross-sectional view of an image sensor according to embodiments of the present invention.

Figure 1:
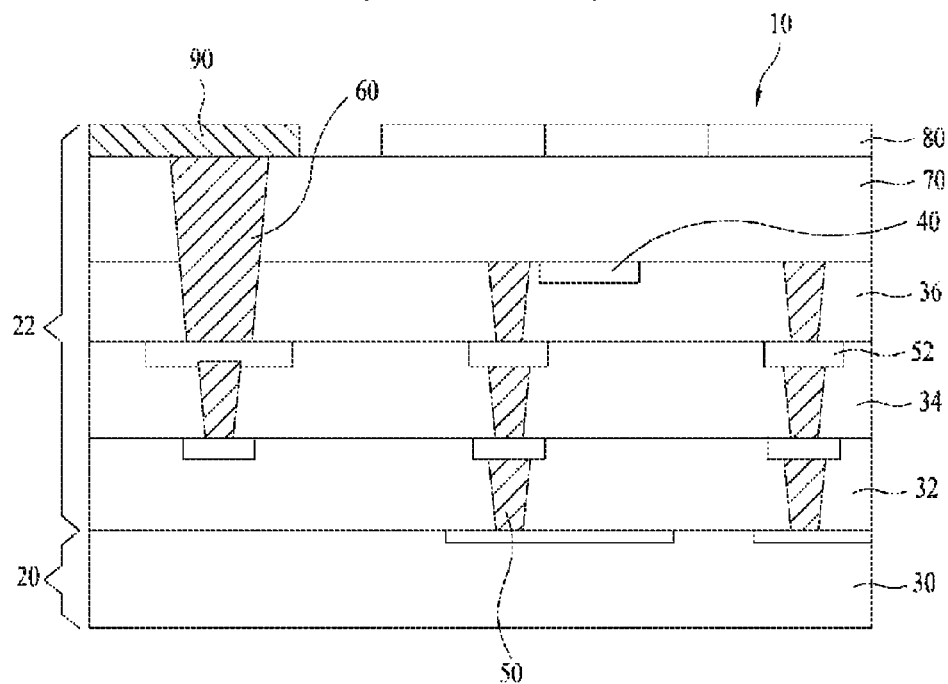
FIG. 1 is a cross-sectional view showing a 3D image sensor according to one related art.

Although only a super via and a light receiving part are shown in FIG. 3 for convenience of explanation, other parts of the image sensor of this embodiment may be the same as the image sensor illustrated in FIG. 1. The image sensor according to FIG. 3 applies a backside illumination (BSI) system that receives light through a light receiving part on the backside of a wafer.

As shown in FIG. 3, a light receiving part 210 of the image sensor may comprise silicon or doped silicon, and perform the same function as the light receiving part 70 of FIG. 1. Super vias 220 generally perform the same function as the super via 60 of FIG. 1.

The super vias 220 are formed in pad regions 200 and 202 and protrude out of the light receiving part 210. A protrusion height 'h' of the super vias 220 may be 0.5~1 μm. Here, the pad regions 200 and 202 refer to regions on which metal pads 240 are formed.

Spacers 230 are formed at lateral sides of each of the super vias 220, and the spacer-forming process is repeated to cover the entire upper surface of the light receiving part 210. The spacers 230 may comprise oxide (e.g., silicon dioxide) and/or nitride (e.g., silicon nitride) layers. In one embodiment, the oxide and nitride layers alternate.

The metal pads 240 are formed in the pad regions 200 and 202 in contact with exposed upper surfaces of the super vias 220.

Hereinafter, a method for manufacturing the image sensor according to the embodiment(s) shown in FIG. 3 will be described with reference to the accompanying drawings.

FIG. 4A to FIG. 4F are cross-sectional views of the image sensor according to embodiments of the present invention.

Figure 4A:
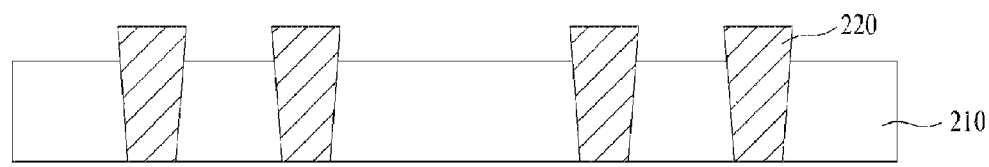
FIG. 4A to FIG. 4F are cross-sectional views illustrating exemplary structures made in a process for manufacturing the image sensor according to various embodiments of the present invention.

Referring to FIG. 4A, the light receiving part 210 is over-polished during backside thinning of the wafer 22 as shown in FIG. 1, such that the upper parts of the super vias 220 which are embedded are partially protruding. Alternatively, the silicon of the light receiving part 210 may be selectively etched (e.g., by wet etching with a dilute aqueous HF/H2O2 solution, or by dry [plasma] etching using a [hydro]fluorocarbon etchant) relative to the metal(s) of the super vias 220 (which may comprise tungsten or copper, with one or more liner layers comprising titanium, titanium nitride, tantalum, tantalum nitride, or bilayers thereof, such as titanium nitride on titanium or tantalum nitride on tantalum).

For example, the height 'h' of the protruding upper part of the super via 210 may be 0.5~1 μm.

Figure 4B:
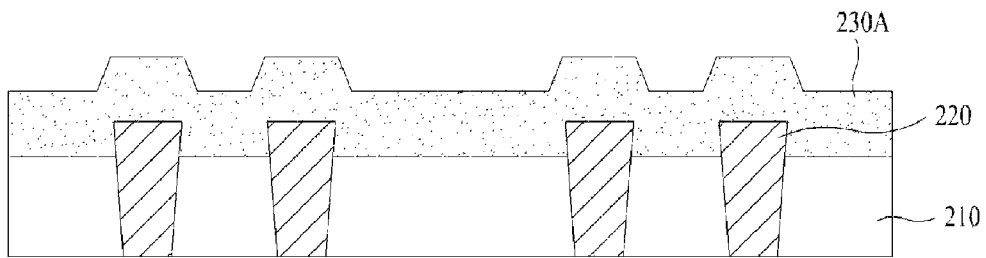

Referring to FIG. 4B, a first insulating layer 230A is deposited by chemical vapor deposition (CVD) over the entire upper surface, covering the protruding super via 220 and the light receiving part 210. For example, the height or thickness of the first insulating layer 230A may be 1.5 μm.

The topology of the first insulating layer 230A may follow the topology of the protruding super via 220 as shown in FIGS. 4A-4B.

Figure 4C:
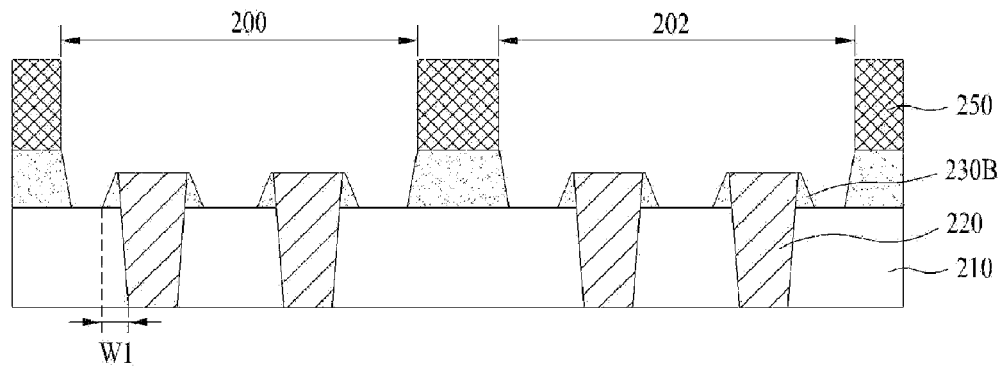

Referring to FIG. 4C, a photoresist pattern 250 is formed on an upper part of the first insulating layer 230A, exposing the pad regions 200 and 202.

More specifically, for example, a photoresist layer (not shown) may be applied to or deposited on the upper part of the first insulating layer 230A, and then patterned by photolithography and developed, thereby forming the photoresist pattern 250 that exposes the pad regions 200 and 202.

Next, the first insulating layer 230A is anisotropically etched using the photoresist pattern 250 as an etching mask, thereby forming the spacers 230B on the lateral sides of each protruding super via 220. The spacers 230B have a width W1. Afterward, the photoresist pattern 250 is removed by asking and stripping.

Figure 4D:
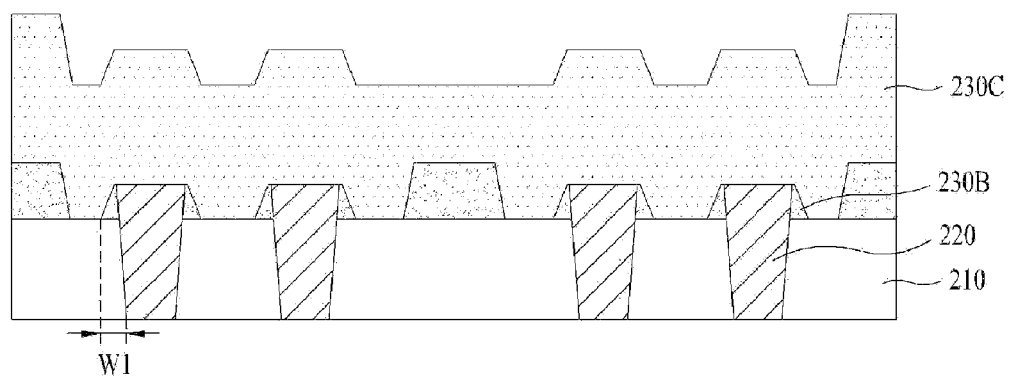
Figure 4E:
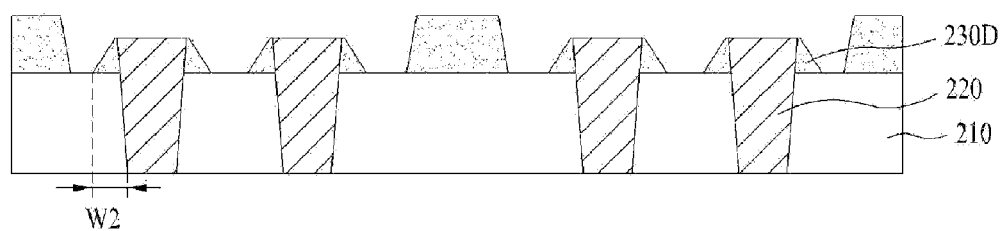
Figure 4F:
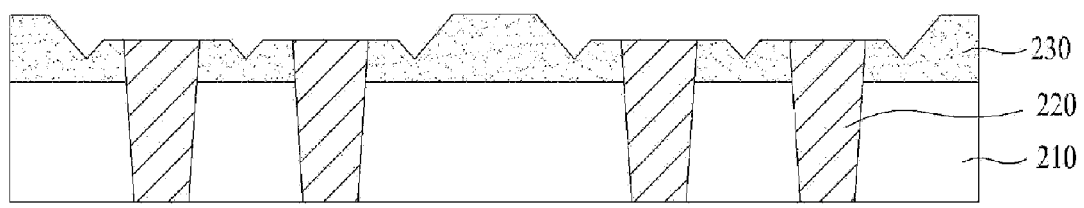
Figure 4F:
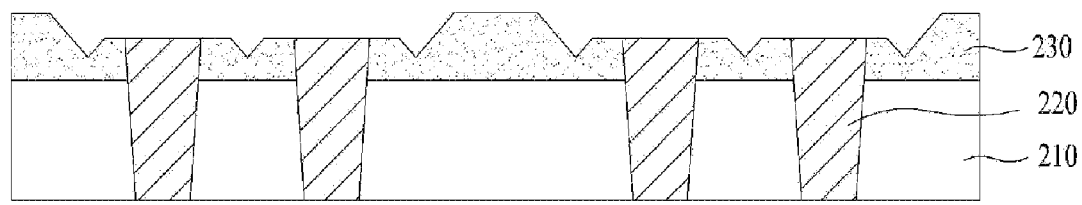

As shown in FIGS. 4D to 4F, a second insulating layer 230C is formed over the entire surface covering the spacers 230B, the super vias 220 and the light receiving part 210, and then blanket-etched (e.g., anisotropically etched or dry etched). The second insulating layer 230C may be the same as or different from the first insulating layer 230B. Such processes are repeated so that the widths W1 of the spacers 230B grow until the upper surface of the light receiving part 210 is totally covered with the spacers 230 adjoining one another. This will be explained in further detail.

Referring to FIG. 4D, the second insulating layer 230C is deposited by CVD (e.g., from a silicon source such as silane or TEOS and an oxygen source such as $O_2$ and/or $O_3$) on the entire surface including upper surfaces of the spacers 230B, the super vias 220 and the light receiving part 210. For example, the height of the second insulating layer 230C may be 0.5~2 μm.

Next, the second insulating material 230C is blanket-etched or anisotropically etched as shown in FIG. 4E. The blanket or anisotropic etching is performed until the upper surfaces of the super vias 220 are exposed.

Accordingly, the width W1 of the spacers 230B shown in FIG. 4C is increased to a larger width W2 as shown in FIG. 4E.

Next, the processes illustrated in FIG. 4D and FIG. 4E are repeatedly performed until the entire upper surface of the light receiving part 210 is covered with the spacers 230.

For instance, if the vapor deposition and blanket etching of the second insulating layer 230C is repeated two or three times, the upper surface of the light receiving part 210 may be covered with the spacers 230 as shown in FIG. 4F so that each spacer 230 adjoins a spacer on an adjacent super via 220.

Here, an oxide layer may be used as the first and the second insulating layers 230A and 230C. Alternatively, an oxide layer may be used as the first insulating layer 230A, and a nitride layer may be used as the second insulating layer 230C, or vice versa.

Next, as shown in FIG. 3, the metal pads 240 are formed in the pad regions 200 and 202 to contact the upper surfaces of the spacers 230.

The metal pad 240 may include Al. For example, after Al (not shown) is deposited (e.g., by sputtering) on the upper surfaces of the super vias 220 and the spacer 230, a photoresist pattern (not shown) that covers the pad regions 200 and 202 but exposes the other parts is formed on the upper surface of the spacers 230 and the super vias 220. The metal pads 240 can be formed as shown in FIG. 3 by etching the Al using the photoresist pattern as a mask.

Figure 2:
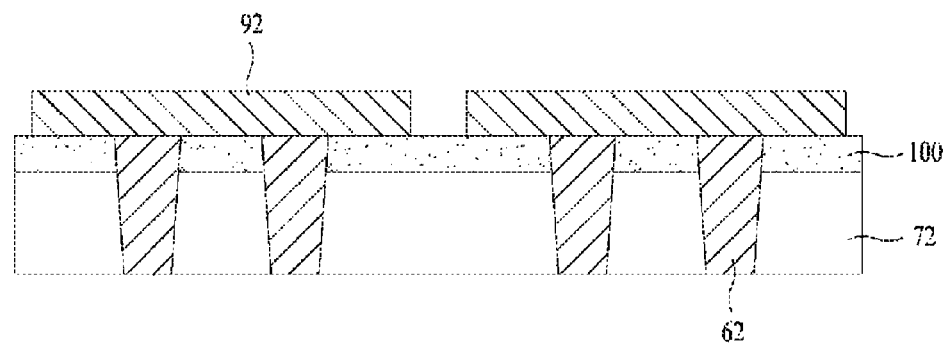
FIG. 2 is a view showing an example of the connection structure between a super via and a metal pad of a 3D image sensor according to another related art.

According to the image sensor of the related art as shown in FIG. 2 and the manufacturing method thereof, the wafer may be broken because the insulating layer 100 formed on the entire surface of the light receiving part 72 is polished by the CMP process until the super vias 62 are exposed.

However, the image sensor and the manufacturing method thereof in accordance with embodiments of the present invention exposes protruding super vias 220, and then spacers 230B are formed by deposition and etching of the first insulating layer 230A. Next, the processes of FIG. 4D to FIG. 4E are repeatedly performed so that spaces between the respective super vias 220 are filled with the insulating layer in the form of layered spacers 230 as shown in FIG. 4F. Therefore, the CMP process is not necessary, and a risk of breakage of the wafer is eliminated. Furthermore, although the metal pads are at upper parts of the super vias, the metal pads and the silicon light receiving part can be isolated from each other, accordingly preventing short circuits.

As apparent from the above description, in accordance with embodiments of the present invention, an insulating layer is interposed between super vias and metal pads in the image sensor and method for manufacturing the same. Therefore, although the metal pads are formed at upper parts of the super vias, the metal pads and the silicon light receiving part can be isolated from each other, accordingly preventing a short circuit.

In addition, spacers are formed on sides of each super via by depositing and etching a plurality of insulating layers, rather than depending on a CMP process. Therefore, breakage of the insulating layer during the CMP process may be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an image sensor, the method comprising:
    polishing a light receiving part of the image sensor so that an upper part of an embedded via partially protrudes;
    forming a first insulating layer over the entire upper surface covering the protruding embedded via and the light receiving part;
    forming a photoresist pattern on an upper part of the first insulating layer, exposing a pad region;
    etching the first insulating layer using the photoresist pattern as an etching mask, thereby forming spacers at lateral sides of the protruding via;
    forming a second insulating layer over the entire surface covering the spacers, the via and the light receiving part and etching the second insulating layer;
    repeating the insulating layer forming and etching steps until widths of the spacers increase and an upper surface of the light receiving part is covered with the spacers; and
    forming a metal pad in the pad region in contact with the via.

2. The manufacturing method according to claim 1, wherein the first and the second insulating layers each comprise an oxide layer.

3. The manufacturing method according to claim 2, wherein the oxide layer comprises a silicon dioxide layer.

4. The manufacturing method according to claim 1, wherein one of the first and the second insulating layers comprises an oxide layer, and the other of the first and the second insulating layers comprises a nitride layer.

5. The manufacturing method according to claim 4, wherein the one insulating layer comprises a silicon dioxide layer, and the other insulating layer comprises a silicon nitride layer.

6. The manufacturing method according to claim 1, wherein the protruding upper part of the super via has a height of 0.5~1 μm.

7. The manufacturing method according to claim 6, wherein the image sensor is made from a wafer or die, and the image sensor receives light through a light receiving part at the backside of the wafer or die.

8. The manufacturing method according to claim 1, wherein the first insulating layer has a height of about 1.5 μm.

9. The manufacturing method according to claim 1, wherein the second insulating layer has a height of about 0.5~2 μm.

10. The manufacturing method according to claim 1, wherein the image sensor comprises a backside illumination (BSI) image sensor.

11. The manufacturing method according to claim 1, wherein the via comprises a super via.

* * * * *